United States Patent
Lifka et al.

(10) Patent No.: US 8,310,149 B2
(45) Date of Patent: Nov. 13, 2012

(54) TRANSPARENT OLED DEVICE EMPLOYING A MIRROR LAYER HAVING A PATTERN OF NONTRANSPARENT AND TRANSPARENT ZONES

(75) Inventors: Herbert Lifka, Son (NL); Cristina Tanase, Waalre (NL); Coen A. Verschuren, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/125,059

(22) PCT Filed: Oct. 19, 2009

(86) PCT No.: PCT/IB2009/054590
§ 371 (c)(1),
(2), (4) Date: Apr. 20, 2011

(87) PCT Pub. No.: WO2010/046833
PCT Pub. Date: Apr. 29, 2010

(65) Prior Publication Data
US 2011/0193477 A1    Aug. 11, 2011

(30) Foreign Application Priority Data
Oct. 21, 2008 (EP) .................................. 08167073

(51) Int. Cl.
*H01J 1/62* (2006.01)
*H05B 33/00* (2006.01)

(52) U.S. Cl. ............... 313/504; 313/506; 313/110
(58) Field of Classification Search ............ 313/504, 313/506, 512, 110–112
See application file for complete search history.

(56) References Cited

U.S. PATENT DOCUMENTS

| | | |
|---|---|---|
| 2002/0130605 A1 | 9/2002 | Mueller et al. |
| 2004/0042199 A1 | 3/2004 | Cok |
| 2004/0077250 A1 | 4/2004 | Miyadera et al. |
| 2005/0269951 A1 | 12/2005 | Handa et al. |
| 2006/0220010 A1 | 10/2006 | Wang et al. |
| 2007/0046190 A1 | 3/2007 | Lo et al. |
| 2007/0077349 A1 | 4/2007 | Newman et al. |
| 2007/0222372 A1 | 9/2007 | Cok et al. |
| 2008/0054802 A1* | 3/2008 | Cok .................. 313/506 |

FOREIGN PATENT DOCUMENTS

| | | |
|---|---|---|
| DE | 10353992 A1 | 6/2005 |
| EP | 1643813 A1 | 4/2006 |
| WO | 2007113707 A1 | 10/2007 |
| WO | 2008027178 A1 | 3/2008 |

* cited by examiner

*Primary Examiner* — Joseph L Williams
(74) *Attorney, Agent, or Firm* — Mark L. Beloborodov

(57) ABSTRACT

Disclosed is an OLED device including an organic layer disposed between an anode and a cathode, and a mirror layer on the anode or cathode. The organic layer is structured into electroluminescent zones and inactive zones, while the mirror layer is structured into nontransparent zones and transparent zones. Via an at least partial alignment of these structures, the OLED device can be made transparent for environmental light and simultaneously emissive in a dominant direction.

10 Claims, 5 Drawing Sheets

TRANSPARENT OLED DEVICE EMPLOYING A MIRROR LAYER HAVING A PATTERN OF NONTRANSPARENT AND TRANSPARENT ZONES

FIELD OF THE INVENTION

The invention relates to an OLED (organic light emitting diode) device with an anode and a cathode between which an organic electroluminescent layer is disposed. Moreover, it relates to an OLED display comprising such OLED devices and to a method for manufacturing such an OLED device.

BACKGROUND OF THE INVENTION

From the US 2002/0130605 A1, a transparent OLED device is known that comprises an electroluminescent organic layer between two transparent electrodes. The transparent electrodes are formed by a pattern of conductive elements, for example metallic particles, that have dimensions small compared to the wavelength of light. The OLED device emits light from both its front side and its back side.

SUMMARY OF THE INVENTION

In view of the above background, it is an object of the present invention to provide an OLED device with an improved functionality, wherein it is desirable that the OLED device is transparent and that the dominant direction of light emission can be adjusted.

This object is addressed by an OLED device according various embodiments of the claimed invention.

According to its first aspect, the invention relates to an OLED device, wherein the term "OLED" shall indicate that the device generates light by electroluminescence of an organic layer in a way that is well-known from organic light emitting diodes (OLEDs). The OLED device includes the following components:

A first transparent electrode layer. This layer will in the following be briefly called "anode" to indicate that it is usually driven with a lower electrical potential than its counter-electrode (the "cathode") during the operation of the OLED device. In general, this denomination shall however not imply any restrictions with respect to the design of the first electrode layer. Moreover, the term "transparent" is to be understood with respect to a given relevant part of the electromagnetic spectrum, which part typically comprises wavelengths emitted by OLED device and wavelengths of the environmental light. Moreover, an object shall be called "transparent" if it has a transparency of at least 10%, preferably at least 50%, most preferably at least 90% in the aforementioned relevant spectral range.

A second transparent electrode layer which will be called "cathode" in the following. To this layer, analogous remarks as for the anode apply.

An organic layer that is disposed between the anode and the cathode. Moreover, said organic layer, the anode, and the cathode shall commonly constitute a functional structure in the organic layer which comprises at least one electroluminescent zone and at least one not-electroluminescent zone, the latter being called "inactive zone" in the following.

Appropriate organic materials that can generate light by electroluminescence are well known from conventional OLEDs. It should be noted that the term "layer" shall comprise multilayer structures, particularly in the case of the organic layer.

An additional layer that will be called "mirror layer" in the following and that has a structure with at least one nontransparent zone that is aligned to an electroluminescent zone of the organic layer, and at least one transparent zone that is aligned to an inactive zone of the organic layer. It should be noted that a zone is called "nontransparent" if its transparency is less than 5%, preferably approximately 0% in the relevant spectral range. The mirror layer may for instance be disposed immediately or indirectly on any side of the anode or cathode, or it may be embedded or integrated into the anode or cathode.

The described OLED device has the advantage that it can at the same time be transparent (at the points where a transparent zone is aligned with an inactive zone) and have a primary or even single direction of light emission (at the points where a nontransparent zone blocks light emission of its associated electroluminescent zone). Depending on the particular dimensions and mutual arrangements of the structures of the organic layer and the mirror layer, these properties can be adjusted over a wide range. Thus the transparency of the whole OLED device can for example be affected via the relative size of the transparent zones in the mirror layer. Moreover, the ratio of the active emissions through the anode and the cathode can be adjusted in the range between 1:1 (equal emissions through both electrodes) and 0:1 (emission to one side only).

According to a first preferred embodiment of the OLED device, the structures of the organic layer and of the mirror layer are in global alignment and/or locally perfect alignment.

"Global alignment" means that the OLED device has a given "alignment axis" (typically an axis perpendicular to the anode, cathode and organic layer), and that, in the direction of this alignment axis, each electroluminescent zone is in line with a nontransparent zone and each inactive zone is in line with a transparent zone. The patterns of electroluminescent/inactive zones on the one hand and transparent/nontransparent zone on the other hand thus follow the same raster though the shapes of the zones may locally deviate from each other.

"Locally perfect alignment" means that, in the direction of this alignment axis, each point of at least one electroluminescent zone is in line with a point of a nontransparent zone and/or that each point of an inactive zone is in line with a point of a transparent zone. At least one electroluminescent/inactive zone and at least one transparent/nontransparent zone are therefore both aligned and geometrically congruent.

A design with a global and locally perfect alignment of structures can for example be used to block the entire emission of the OLED device in one direction.

In an alternative embodiment, the structures of the organic layer and the mirror layer are only partially aligned. At least one electroluminescent zone can for example not be in line with a nontransparent zone with respect to the aforementioned alignment axis of the OLED device, thus achieving some emission in a secondary direction.

The term "mirror layer" has been chosen in view of a preferred embodiment of the invention, in which the nontransparent zone of this layer is reflective on the side that faces the organic layer (in the most general case, it suffices however that the nontransparent zones of the "mirror layer" are not transparent in the relevant spectral range). Light generated in the corresponding electroluminescent zone of the organic layer is then reflected back to said layer such that it is not lost but emitted into a desired direction.

The nontransparent zones of the mirror layer may preferably comprise a metal, for example a metal selected from the group consisting of silver (Ag), aluminum (Al), copper (Cu) and gold (Au) (but not restricted to only these metals).

The nontransparent zones of the mirror layer will typically cover about 10% to 90% of the area of the mirror layer. The smaller the covered percentage is, the higher is the transparency of the OLED device.

The nontransparent zones may quite arbitrarily be shaped and distributed in the area of the mirror layer. Preferably, they are shaped as (elliptical, circular, rectangular, and other geometrical shapes) dots or stripes and distributed in a regular or irregular (random) pattern.

The transparent and/or the nontransparent zones of the mirror layer may typically have a (mean) diameter ranging between 1 micron (lower limit of conventional lithography) and 100 micron. In this context, the term "diameter" has to be defined appropriately for non-circular shapes of the zones, for example as the diameter of the largest circle that can completely be inscribed into said shape. The diameter of the transparent and/or nontransparent zones is preferably chosen such that the mirror layer can readily be manufactured and that undesired optical effects (e.g. noticeable patterns or diffraction) are avoided. Larger diameters or larger graphical structures can be used as well, or in combination with the smaller diameter zones, in order to achieve visually pleasing, visible patterns.

The OLED device will typically comprise additional structures and/or layers to provide for example mechanical stability or a sealing against the environment. In particular, it may comprise a transparent substrate like a glass or plastic layer serving as a carrier on which the anode or cathode is disposed.

The functional structure of electroluminescent and inactive zones in the organic layer can be achieved in different ways. Thus it is for example possible that the material of the organic layer itself is physically structured to show different electroluminescent properties in these zones. Another possibility is that the anode and/or the cathode is structured into zones of different charge-carrier injection properties; zones with normal injection properties will then yield the electroluminescent zones in the (materially homogenous) organic layer, while zones with reduced or no injection properties will yield the inactive zones in the organic layer.

According to another embodiment of the invention, the OLED device comprises not just one multilayer unit with an anode, cathode and organic layer, but a stack of several such multilayer units. Each of these multilayer units comprises an anode, a cathode and an organic layer, wherein the organic layers of the different units have different emission characteristics, for example emission peaks in the red, green and blue range, respectively. Moreover, the organic layer of at least one of the multilayer units is functionally structured into electroluminescent zones and inactive zones to achieve the above described interaction with the mirror layer. Preferably, all organic layers of the multilayer units are functionally structured into electroluminescent zones and inactive zones, wherein the corresponding structures may be the same and aligned to each other or different and not aligned.

According to a second aspect, the invention relates to an OLED display as it can for example be used in computer monitors or in information/advertisement signs to display symbols, pictures etc. The OLED display is characterized in that it comprises a pattern of individually controllable pixels that are constituted by OLED devices of the kind described above. This means that each of the pixels comprises (at least) one multilayer unit with an anode, a functionally structured organic layer, and a cathode as well as a mirror layer. As known in the state of the art, the OLED display is preferably patterned into a plurality of cells that each comprise a set of pixels with primary colors, for example emitting in red, green and blue, respectively. The OLED display has the advantage that it is at least partially transparent while its active emission is different on the front side and the back side.

The invention further relates to a method for manufacturing an OLED device of the kind described above, the method comprising the following steps that may be executed in the listed or any other sequence:

Preparing a (completely) electroluminescent organic layer between two transparent electrode layers, i.e. an "anode" and a "cathode". This step corresponds to the well known fabrication of a usual OLED. It should be noted that the preparation may comprise the use of further layers, for example of a transparent substrate.

Structuring the aforementioned organic layer by deleting the electroluminescence locally in at least one zone to generate a structure of electroluminescent zones and inactive zones. Appropriate methods to destroy the electroluminescence in the organic layer, e.g. via infrared irradiation, are familiar to a person skilled in the art.

It should be noted that the treated zones shall be inactive with respect to electroluminescence but shall be/remain transparent.

Depositing a structured mirror layer (directly of indirectly) at the anode or at the cathode such that at least one nontransparent zone of the mirror layer is (finally, i.e. in the finished OLED device) aligned to an electroluminescent zone of the structured organic layer and that at least one transparent zone of the mirror layer is (finally) aligned to an inactive zone of the organic layer.

For more information on the details and variants of the manufacturing method, reference is made to the above description of the product of this method, i.e. the OLED device.

A preferred method to delete the electroluminescence locally in the organic layer is to irradiate the layer with light of a specific wavelength and a high intensity, for example an intensity of more than 10 MW/cm$^2$. Thus the organic materials can be affected, for example decomposed, in such a way that the chain of processes leading to electroluminescence is interrupted.

According to a preferred embodiment of the manufacturing method, the mirror layer is deposited at the anode or cathode before the electroluminescence is locally deleted. In this case the structure of the mirror layer can be used as a kind of mask for the generation of the structure in the organic layer. The organic layer can for example be irradiated through the mirror layer such that the regions in the shadow of the nontransparent zones of the mirror layer are protected from the radiation and thus keep their electroluminescence. Advantages of this approach are a simplified irradiation scanning (full area) and an automatic/accurate alignment.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

Like reference numbers or numbers differing by integer multiples of 100 refer in the Figures to identical or similar components.

Transparent OLEDs (organic light emitting devices) are desirable for several applications, for example for windows as light sources, privacy windows, signage, or decorative lamps. If a usual OLED device is produced with transparent components, it is emissive in the front and back side simultaneously. For several applications, it would however be preferred to have a high transparency combined with no emission to the back side and good emission to the front side. At the same time, this should not lead to a reduction in efficiency.

To address the above issues, an OLED design is proposed here in which an organic layer is functionally structured into electroluminescent zones and inactive (i.e. not electroluminescent) zones and in which a mirror layer is provided with (i) at least one nontransparent zone that is in alignment with an electroluminescent zone of the organic layer and with (ii) at least one transparent zone that is an alignment with an inactive zone of the organic layer. In the following, various preferred embodiments of this general concept will be described in more detail.

Figure 1:
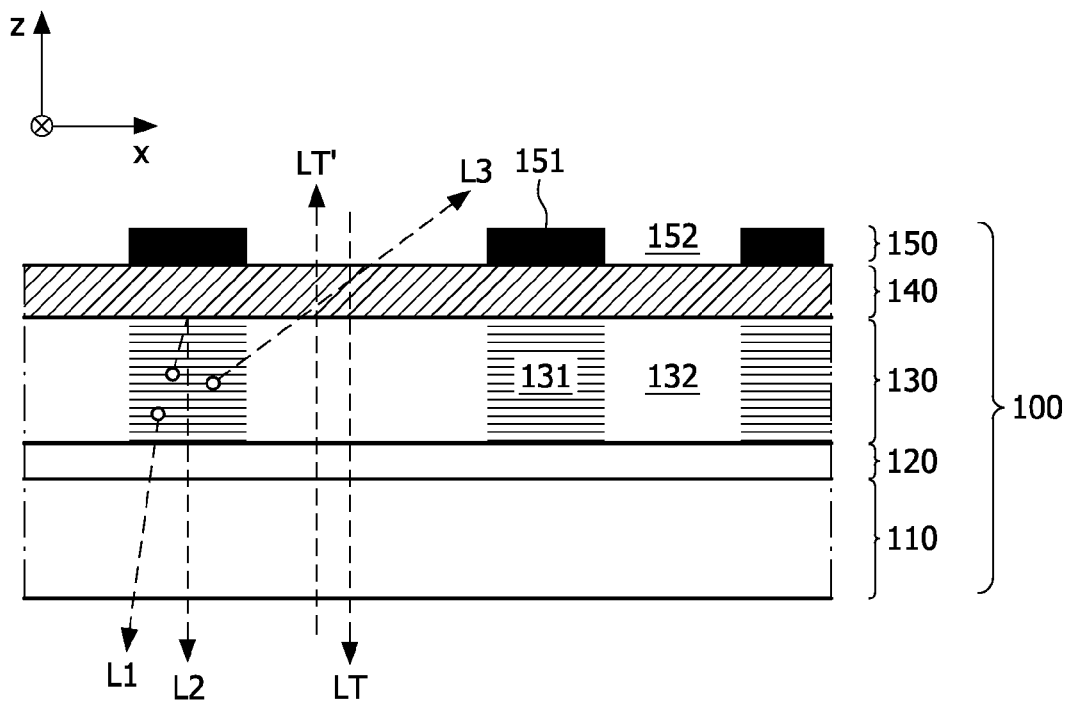
FIG. 1 illustrates schematically a section through a first OLED device according to the present invention.

FIG. 1 shows in a schematic sectional side view a first OLED device 100 according to the present invention. Seen in the positive z-direction of the corresponding coordinate system, the OLED device 100 comprises the following sequence of layers:

A transparent substrate 110, for example made from glass or a transparent plastic with a water barrier. The substrate provides mechanical stability and protects the sensitive optoelectronic layers.

A first transparent electrode layer 120, called "anode", that may for example consist of indium tin oxide (ITO), doped zinc-oxide or an organic layer such as PEDOT:PSS, possibly in combination with a fine metal grid structure to lower the effective sheet resistance.

An organic layer 130 that is functionally (and, in this embodiment, also physically) structured into electroluminescent zones 131 and inactive (i.e. not electroluminescent) zones 132, wherein said zones are arranged next to each other in x-direction and extend through the complete organic layer in z-direction. In the electroluminescent zones 131, light is generated by the processes known from conventional OLEDs when electrons and holes injected into this layer from different sides recombine. The inactive zones 132 typically consist of modified material of the electroluminescent zones 131. In general, the inactive zones might however consist of a completely different (organic or anorganic) material.

A second transparent electrode layer 140, called "cathode", that is for example constituted by a thin layer of silver (Ag).

A "mirror layer" 150 that consists of a pattern of nontransparent zones 151 and transparent zones 152. In the example of FIG. 1, the structure of the mirror layer 150 is in global and locally perfect alignment with the structure of the organic layer 130, wherein the alignment is judged with respect to a given alignment direction (z-direction in the shown embodiment). As suggested by the Figure, the transparent zones 152 may simply be empty, i.e. open to the environment. Preferably, the OLED device 100 is however finished and sealed on its top side by some transparent packaging that is not shown in the Figure.

When an appropriate voltage is applied between the anode 120 and the cathode 140, light will be generated in the electroluminescent zones 131. As indicated by light ray L1, a part of this light will immediately be directed to the substrate 110 and leave the OLED device 100 as desired through its front side (bottom in the Figures).

As indicated by light ray L2, another part of the generated light will be emitted in the opposite direction (positive z-direction) towards the back side of the OLED device 100. Due to the nontransparent zones 151 of the mirror layer 150, an emission through the back side is however blocked. As the nontransparent zones 151 are typically reflective on their bottom side, the light ray L2 is not simply absorbed but instead reflected and will thus be able to leave the OLED device 100 through the front side, too.

As indicated by light rays LT and LT', environmental light can freely pass through the OLED device 100 in the transparent zones 152 of the mirror layer. As a consequence, the OLED device 100 will appear (at least partially) transparent and have at the same time a dominant or primary direction of active light emission (negative z-direction in FIG. 1).

It should be noted that FIG. 1, which is only schematic and not to scale, suggests that light rays L3 generated in the electroluminescent zones 131 and directed under an angle in the positive z-direction might leave the OLED device 100 through the transparent zones 152. If such a reduced emission through the back side is undesired, it might for example be blocked by making the nontransparent zones 152 somewhat larger than the corresponding electroluminescent zones 131.

Figure 2:
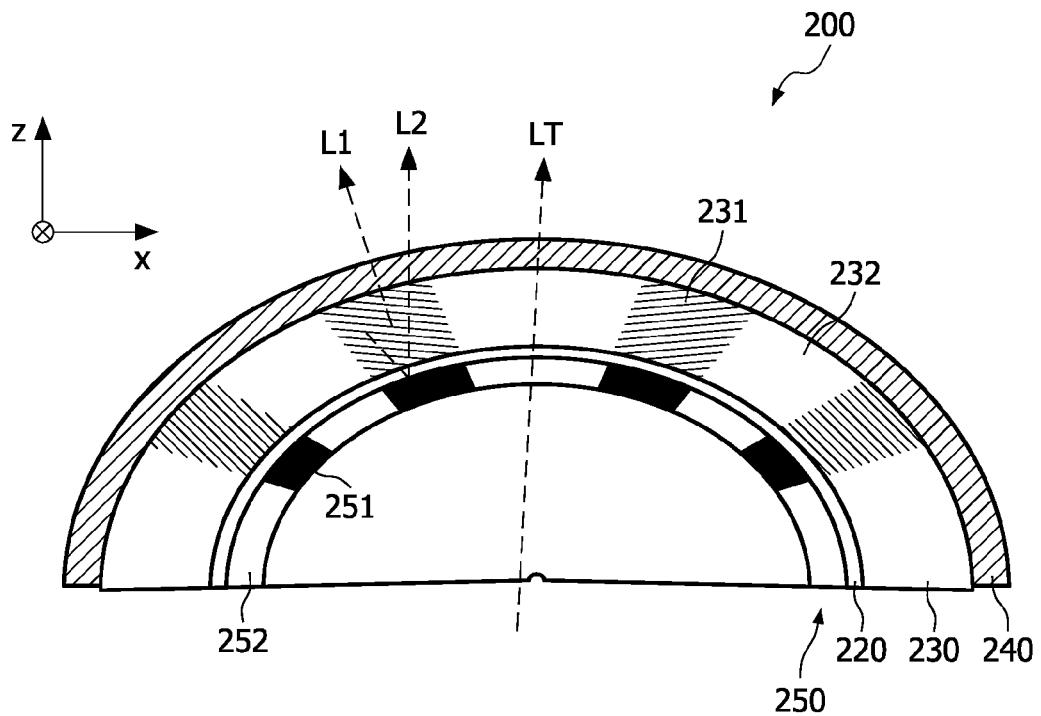
FIG. 2 illustrates schematically a section through a second OLED device with curved surfaces.

FIG. 2 shows an alternative design of a second OLED device 200. Basically, the structure of this OLED device 200 is similar to that of the first OLED device 100 so that it is not necessary to describe it in detail again. A first difference of the second OLED device 200 is that the substrate 210 is curved, for example because it is a glass lens or it is a flexible substrate. Consequently, the other layers are curved, too. A second difference is that the structured mirror layer 250 with its nontransparent zones 251 and transparent zones 252 is now disposed next to the anode 220, here between the anode and the substrate 210.

Figure 3:
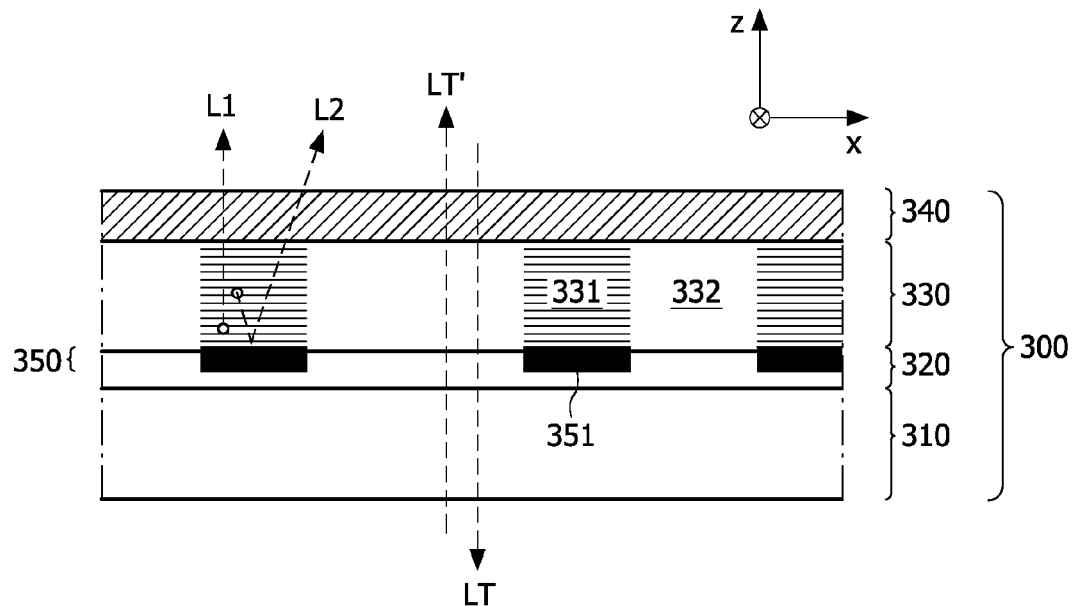
FIG. 3 illustrates schematically a section through a third OLED device with a mirror layer between the anode and the organic layer.

FIG. 3 shows a third OLED device 300 according to the present invention. Again, the basic design is similar to that of FIG. 1. The structured mirror layer 350 with its nontransparent zones 351 is however now disposed between the anode 320 and the organic layer 330. As the Figure suggests, the nontransparent (e.g. metallic) zones 351 may be embedded in the transparent material of the anode 320.

Figure 4:
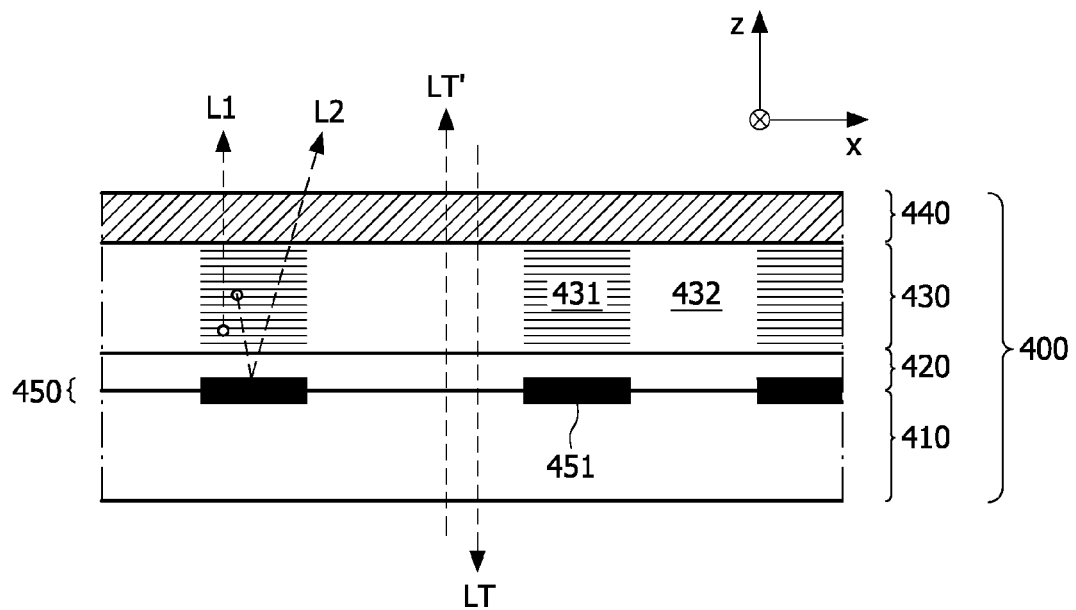
FIG. 4 illustrates schematically a section through a fourth OLED device with a mirror layer between the anode and a substrate.

FIG. 4 shows as a variant of the aforementioned embodiment a fourth OLED device 400, in which the structured mirror layer 450 with its nontransparent zones 451 is disposed between the anode 420 and the substrate 410. The nontransparent zones 451 may again be embedded in the transparent material of the anode 420.

Figure 5:
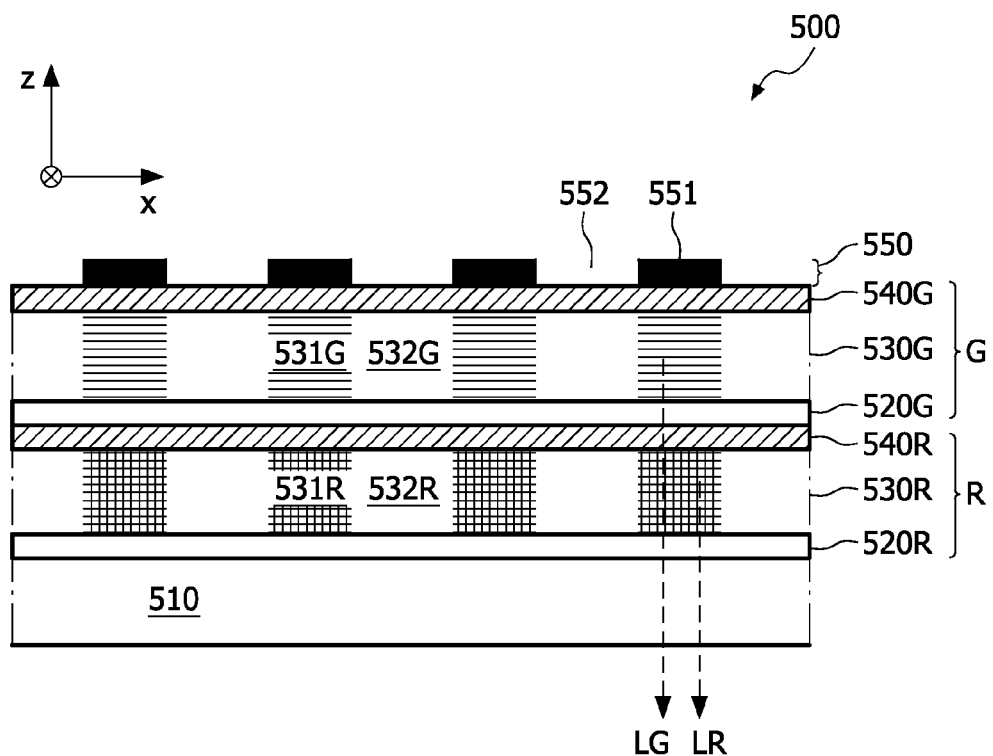
FIG. 5 illustrates schematically a section through a fifth OLED device with a stack of several multilayer units of different colors.

FIG. 5 shows a fifth OLED device 500 according to the present invention. Again, the basic design is similar to that of FIG. 1. The OLED device 500 comprises however not just one, but two multilayer units R, G. The first multilayer unit R, constituted by a first anode 520R, a first organic layer 530R, and a first cathode 540R, is disposed on the substrate 510, and its organic layer 530R has an emission peak in the red part of the spectrum. The second multilayer unit G, constituted by a second anode 520G, a second organic layer 530G, and a second cathode 540G, is disposed on the first multilayer unit R, and its organic layer 530G has an emission peak in the green part of the spectrum. On top of this second multilayer unit G, the structured mirror layer 550 is disposed.

Due to the different organic layers with their different emission characteristics, red light LR and green light LG can be emitted by the OLED device 500. If the electrodes of the two multilayer units R, G are individually controllable, the color point of the OLED device 500 can be adjusted accordingly.

It should be noted that of course further multilayer units can be added, particularly one further multilayer unit emitting blue light.

Figure 6:
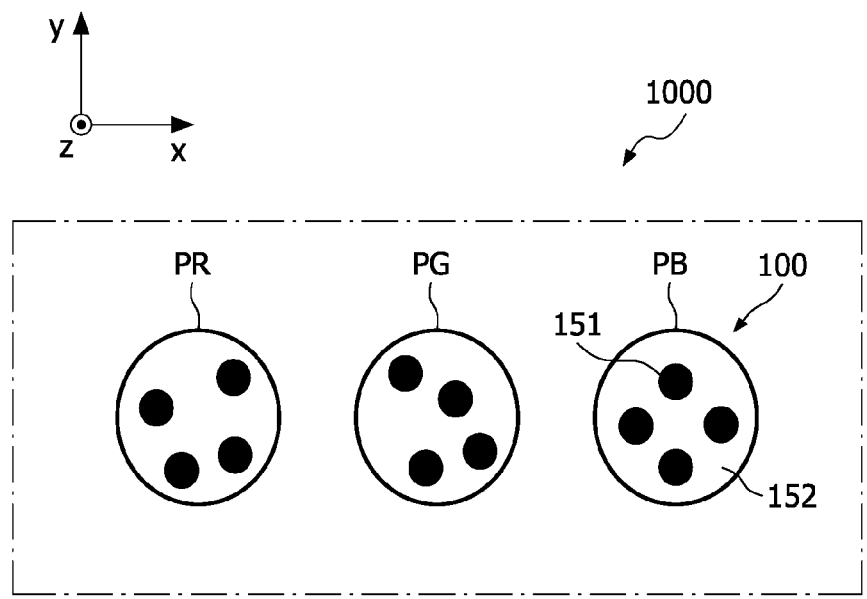
FIG. 6 shows a top view on pixels of an OLED display according to the present invention.

FIG. 6 illustrates a top view onto a (small) part of an OLED display 1000. As usual, the OLED display 1000 comprises a multitude of individually controllable light emitting picture element (pixels), wherein groups of three pixels each with different primary colors are located close to each other. In the OLED display 1000, the shown circular pixels PR, PG, PB of the primary colors red, green and blue, respectively, are constituted by OLED devices 100 of the kind described in FIG. 1. The top view onto these pixels shows the nontransparent zones 151 of the mirror layer and the residual transparent zones 152.

Figure 7:
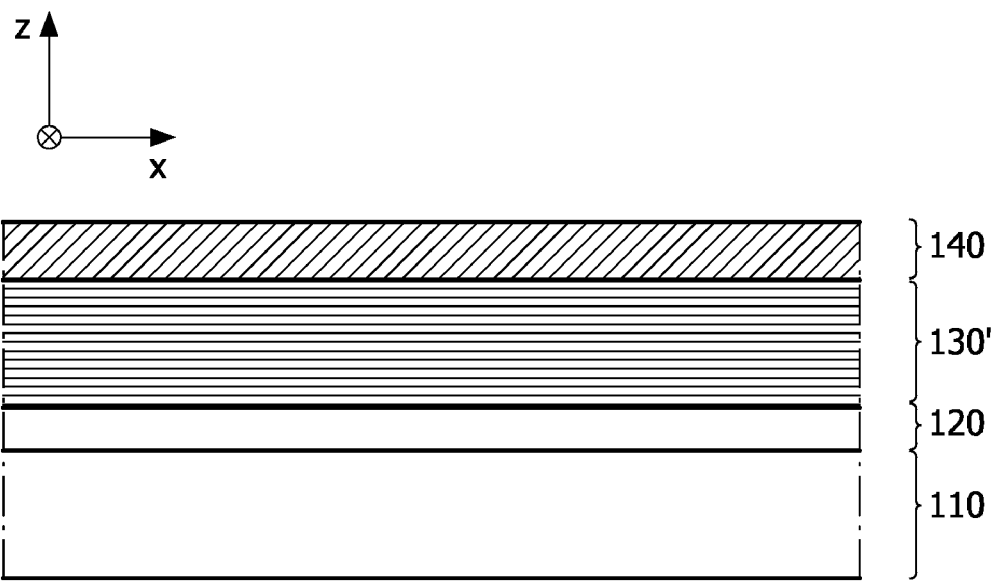
FIGS. 7 to 9 illustrate consecutive steps of a manufacturing process for the first OLED device.
Figure 8:
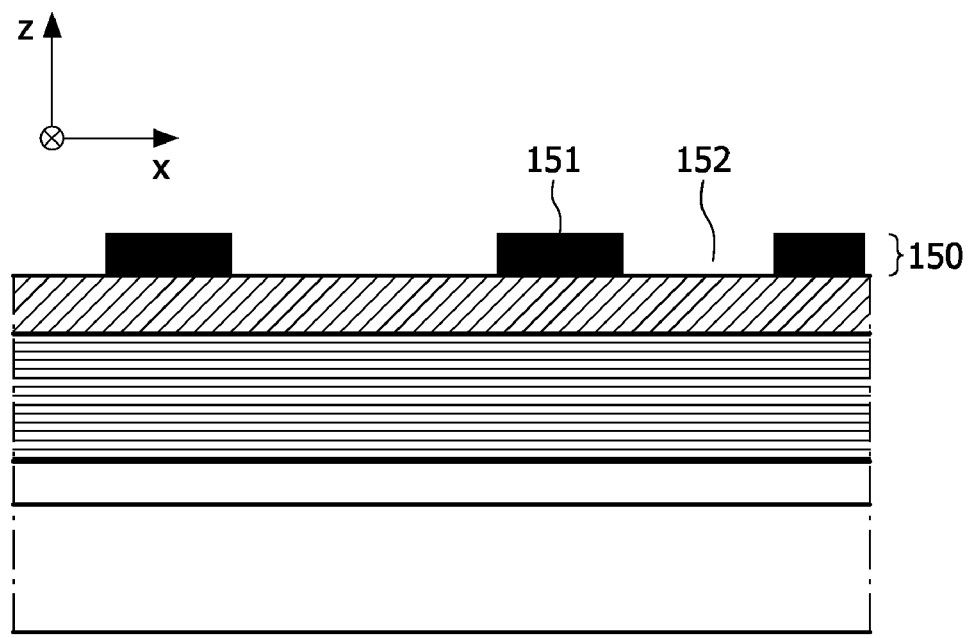
Figure 9:
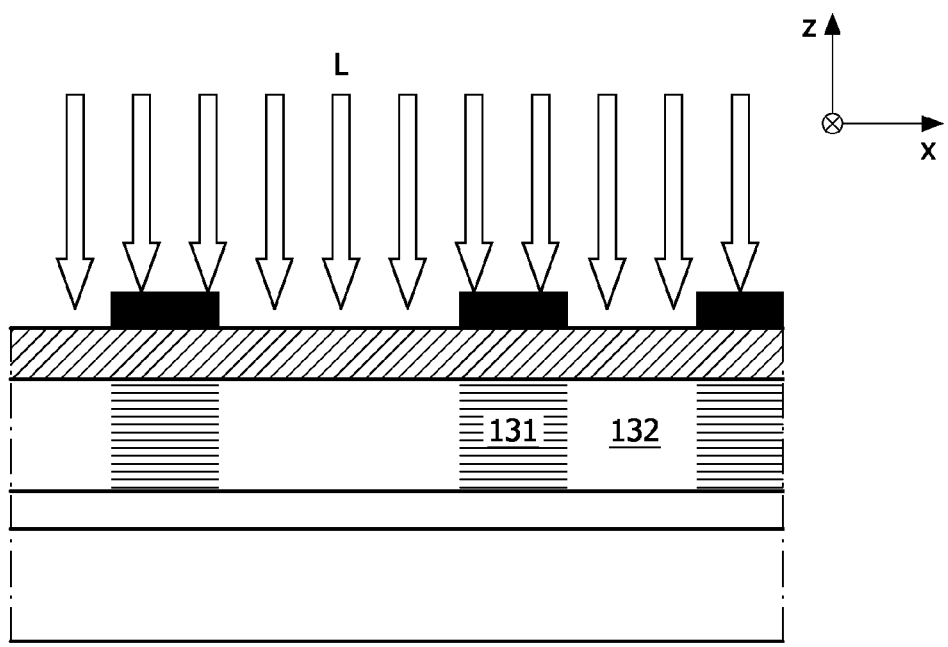

FIGS. 7 to 9 show consecutive steps of the manufacture of the first OLED device 100.

According to FIG. 7, the manufacture starts with a conventional transparent OLED device comprising a sequence of a transparent substrate 110, a transparent anode 120, a uniformly electroluminescent organic layer 130', and a transparent cathode 140. The organic layer can for example be a small molecule (smOLED) or polymer OLED layer.

According to FIG. 8, a dotted thick metal (e.g. Ag or Al) structure is deposited in a first extra step as a "mirror layer" 150 on the transparent cathode. The mirror layer comprises nontransparent zones 151 that are preferably reflecting and conductive. The dots of the pattern should cover much less than 70% of the total area to keep the transparency acceptable. The shape and arrangement of the dots can be chosen freely, depending on the desired appearance. For example, square, rectangular or circular dots can be used, in a regular configuration (e.g. grid, honeycomb, . . . ) or in a random fashion. The latter can have the advantage that interference and Moiré effects are reduced or suppressed. Other shapes than dots, e.g. stripes or concentric circles are also possible, providing more design freedom in the final appearance, especially for implementations where the metal areas are reasonably well visible. The OLED can be packed with e.g. a glass packaging or with a transparent thin film packaging (not shown).

FIG. 9 shows the second extra step in which the OLED is exposed with high intensity light L from the back side (top in the Figure), so that either the electroluminescence from the OLED is locally killed (in case of polymer-based devices) or that local current blocking and/or injection prevention is achieved by local modification of at least one of the carrier (hole or electron) injection layers, e.g. Alq$_3$ or NPD, or their interfaces. During this deletion of the electroluminescence, the dotted structure of the mirror layer protects the organic layer locally so that zones 131 remain electroluminescent. This process is self-aligned, so the exposure can be full area exposure.

It is also possible to kill the electroluminescence before packaging. A typical process how to kill the electroluminescence can be found in the European Patent application EP 07119048.2 (filed Oct. 23, 2007).

The result of killing the electroluminescence in the OLED or locally preventing current injection will be a device which emits only to the front with good efficiency. One can still look through it from the back while it is emitting light.

Different modifications of the described manufacture process are possible. Instead of a full area exposure, one can for example also do the light exposure in a patterned way to gain certain light effects from the top side. On the front side of the OLED device 100, different light intensities can be made this way, e.g. a front-side bright spot with less bright rays going from it, on the back side a dark spot with rays coming from it. Moreover, the mirror layer may alternatively be disposed directly in contact to the organic layer, thus being sandwiched between the organic layer and the anode or cathode.

When the mirror layer is disposed at the anode, as shown in FIGS. 2, 3, and 4, the exposure to delete the electroluminescence has to be performed from the front side of the OLED device.

Figure 10:
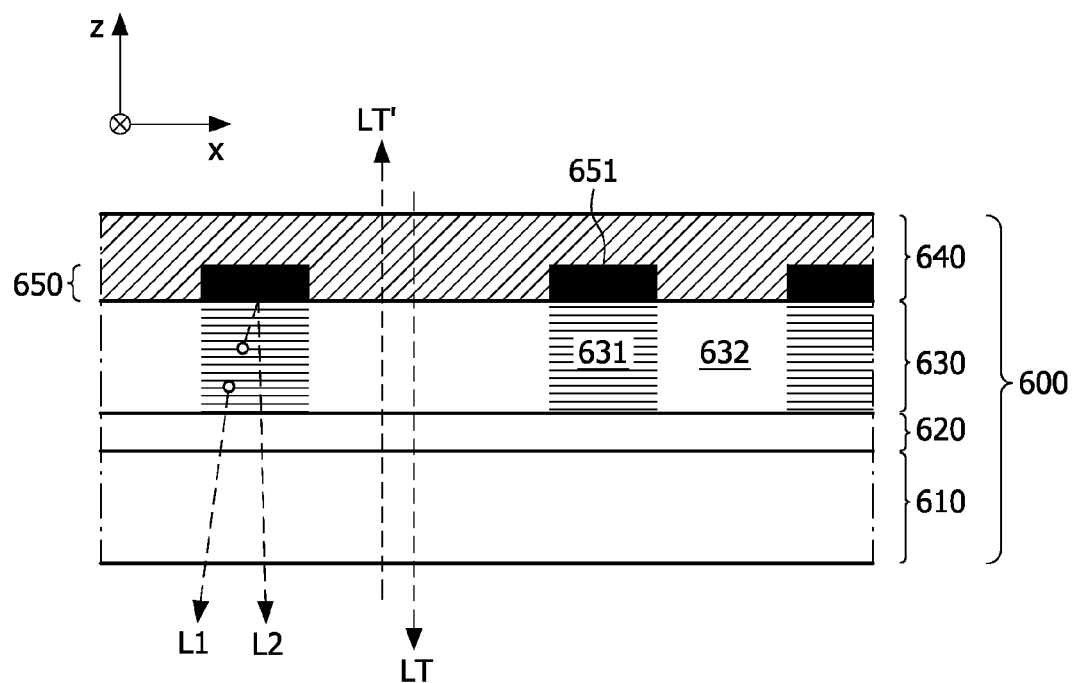
FIG. 10 illustrates schematically a section through a sixth OLED device with a cathode that has zones of different injection properties.

FIG. 10 shows a sixth embodiment of an OLED device 600 according to the invention. A first difference with respect to the embodiment of FIG. 1 is that the nontransparent zones 651 of the mirror layer 650 are integrated into the cathode 640 and disposed in contact to the organic layer 630. Moreover, the functional structure of electroluminescent zones 631 and inactive zones 632 in the organic layer 630 is achieved in this embodiment by a difference in charge carrier injection. In particular, the material of the cathode 640 has bad injection properties, while the reflecting dots of the nontransparent zones 651 have a good injection, cf. patent application EP 08 160 087.6 (filed Jul. 10, 2008). In this case no laser killing of electroluminescence is required (though it can still be applied). The same procedure may also be applied on the anode side.

All of the above embodiments can also be used in combination with flexible transparent OLED structures. Moreover, it is of course possible that two or more mirror layers are provided, e.g. one at the anode and one at the cathode.

Examples for the application of an OLED device of the kind described above comprise:
- Windows which emit during the night only into the room, while the sun can pass during the day. If required, some more light can be added to sunlight.
- Green house lighting: during the day the sun can be used (from roof and walls) and e.g. red (or other color) OLED panels can be added to enhance growth.
- Various design lamps.
- Signage designs.
- Lamps/windows indicating "occupied/free" for a meeting room.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:
1. An OLED device, comprising:
an anode formed by a first transparent electrode layer;
a cathode formed by a second transparent electrode layer;

an organic layer disposed between the anode and the cathode, said organic layer comprises at least one electroluminescent zone and at least one inactive zone;

a mirror layer comprising at least one nontransparent zone aligned to the electroluminescent zone and at least one transparent zone aligned to the inactive zone of the organic layer; and a transparent substrate, wherein said anode, cathode, organic layer, support structure, and the transparent zone of the mirror layer are configured for passing through environmental light.

2. The OLED device according to claim 1, wherein the structures of the organic layer and the mirror layer are in perfect alignment.

3. The OLED device according to claim 1, wherein the structures of the organic layer and the mirror layer are only partially aligned.

4. The OLED device according to claim 1, wherein the nontransparent zones of the mirror layer are reflective on the side that faces the organic layer.

5. The OLED device according to claim 1, wherein the nontransparent zones of the mirror layer comprise Ag, Al, Cu and/or Au.

6. The OLED device according to claim 1, wherein the nontransparent zones cover about 10% to 90% of the area of the mirror layer.

7. The OLED device according to claim 1, wherein the nontransparent zones of the mirror layer are shaped as dots or stripes distributed in a regular or irregular pattern.

8. The OLED device according to claim 1, wherein the transparent zones and/or the nontransparent zones of the mirror layer have a diameter between about 1 μm and about 100 μm.

9. The OLED device according to claim 1, wherein the anode and/or the cathode is structured into zones of different charge-carrier injection properties.

10. The OLED device according to claim 1, comprising a stack of multilayer units each having an anode, an organic layer, and a cathode, wherein the organic layers have different emission characteristics.

* * * * *